United States Patent
Choi et al.

(10) Patent No.: US 10,437,145 B2
(45) Date of Patent: Oct. 8, 2019

(54) METHOD OF DETACHING A PELLICLE FROM A PHOTOMASK

(71) Applicant: SAMSUNG ELECTRONICS CO., LTD., Suwon-si, Gyeonggi-do (KR)

(72) Inventors: Jae-hyuck Choi, Seoul (KR); Jin-su Kim, Hwaseong-si (KR); Kyoung-mi Kim, Anyang-si (KR); Byung-gook Kim, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 52 days.

(21) Appl. No.: 15/865,717

(22) Filed: Jan. 9, 2018

(65) Prior Publication Data

US 2018/0136555 A1     May 17, 2018

Related U.S. Application Data

(62) Division of application No. 14/849,235, filed on Sep. 9, 2015, now Pat. No. 9,880,462.

(60) Provisional application No. 62/085,377, filed on Nov. 28, 2014.

(30) Foreign Application Priority Data

Jan. 21, 2015   (KR) .................. 10-2015-0010030

(51) Int. Cl.
   *G03F 1/64*   (2012.01)

(52) U.S. Cl.
   CPC ..................... *G03F 1/64* (2013.01)

(58) Field of Classification Search
   CPC .......................................... G03F 1/64
   USPC ........................................... 430/5
   See application file for complete search history.

(56) References Cited

U.S. PATENT DOCUMENTS

| | | |
|---|---|---|
| 6,368,683 B1 | 4/2002 | Shirasaki |
| 6,492,067 B1 | 12/2002 | Klebanoff et al. |
| 6,713,136 B2 | 3/2004 | Tsumoto et al. |
| 6,869,733 B1 | 3/2005 | Su |
| 6,911,283 B1 | 6/2005 | Gordon et al. |
| 7,372,549 B2 | 5/2008 | Bijvoet |
| 7,901,841 B2 | 3/2011 | Shirasaki |
| 7,901,847 B2 | 3/2011 | Mushell et al. |
| 8,349,526 B2 | 1/2013 | Shirasaki |
| 8,394,557 B2 | 3/2013 | Shirasaki et al. |
| 8,582,077 B2 | 11/2013 | Shirasaki |
| 8,652,711 B2 | 2/2014 | Shirasaki |
| 8,685,598 B2 | 4/2014 | Murakami et al. |
| 8,724,088 B2 | 5/2014 | Lin et al. |
| 9,880,462 B2 * | 1/2018 | Choi ..................... G03F 1/64 |
| 2005/0025959 A1 | 2/2005 | Bellman |
| 2006/0269847 A1 | 11/2006 | Holmes et al. |
| 2008/0259291 A1 | 10/2008 | Banine |

(Continued)

FOREIGN PATENT DOCUMENTS

| | | |
|---|---|---|
| JP | 07-175206 A | 7/1995 |
| JP | 2005-140887 A | 6/2005 |

(Continued)

OTHER PUBLICATIONS

Taiwanese Office Action dated Jun. 14, 2019.

*Primary Examiner* — Christopher G Young

(74) *Attorney, Agent, or Firm* — Lee & Morse, P.C.

(57) ABSTRACT

A pellicle includes a pellicle frame, a pellicle membrane, and an attaching element, a first surface of the attaching element having exposed pores.

4 Claims, 16 Drawing Sheets

(56) References Cited

U.S. PATENT DOCUMENTS

2011/0027700 A1    2/2011   Shirasaki
2014/0170535 A1    6/2014   Yano et al.

FOREIGN PATENT DOCUMENTS

| JP | 2013-195950 A | 9/2013 |
| TW | 535031 B | 6/2003 |
| TW | 2011-04354 A | 2/2011 |
| TW | 201214023 A | 4/2012 |

* cited by examiner

METHOD OF DETACHING A PELLICLE FROM A PHOTOMASK

CROSS-REFERENCE TO RELATED APPLICATIONS

This is a divisional application based on pending application Ser. No. 14/849,235, filed Sep. 9, 2015, the entire contents of which is hereby incorporated by reference.

The present application claims priority under 35 U.S.C. § 119(e) to U.S. Provisional Application No. 62/085,377, filed on Nov. 28, 2014, and entitled: "Pellicle and Exposure Mask Including The Same," which is incorporated herein by reference in its entirety.

Korean Patent Application No. 10-2015-0010030, filed on Jan. 21, 2015, in the Korean Intellectual Property Office, and entitled: "Pellicle and Exposure Mask Including The Same," is incorporated by reference herein in its entirety.

BACKGROUND

1. Field

Embodiments relate to a pellicle and an exposure mask including the pellicle.

2. Description of the Related Art

As semiconductor devices are being downscaled, research has been conducted into shifting an exposure process from deep ultraviolet (DUV) lithography to an extreme UV (EUV) lithography using light having much shorter wavelengths than the DUV lithography.

SUMMARY

Embodiments are directed to a pellicle, including a pellicle frame, a pellicle membrane, and an attaching element, a first surface of the attaching element having exposed pores.

The exposed pores may have a pore density of about $1 \times 10^6 / cm^2$ to about $5 \times 10^9 / cm^2$.

The exposed pores may be arranged in a regular array.

The regular array may have a lattice pattern, a honeycomb pattern, or a combination thereof.

The first surface may have a discontinuous shape.

The first surface may be formed of an elastomer.

The elastomer may include a polyamide elastomer, an acrylate elastomer, a styrene elastomer, a polyolefin elastomer, a polyoxyalkylene elastomer, a polyester elastomer, an epoxy elastomer, a polyvinyl chloride elastomer, a silicon elastomer, a fluorine elastomer, a polyurethane elastomer, a nitrile elastomer, an ethylene propylene diene monomer elastomer, or a combination thereof.

The elastomer may have a number average molecular weight of about 5,000 g/mol to about 500,000 g/mol as measured by gel permeation chromatography using polystyrene as a standard.

The pellicle membrane may be a single silicone, a polysilicone, or a nanographite film.

The attaching element may include a first attaching element and a second attaching element that are sequentially stacked on a surface of the pellicle frame in a direction in which the pellicle is attached to a photomask.

The first attaching element may be disposed between the second attaching element and the pellicle frame, the first attaching element may be formed of a material having a lower hardness than a material forming the second attaching element, and the second attaching element may have the exposed pores.

The pellicle may further include an adhesive between and contacting the pellicle membrane and the pellicle frame, the adhesive being disposed on a surface of the pellicle frame opposite the first and second attaching elements.

The attaching element may include a first attaching element and a second attaching element that are disposed side by side on a surface of the pellicle frame.

The first attaching element may be disposed closer to an interior region around which the pellicle frame is disposed, relative to the second attaching element, the first attaching element may be formed of a material exhibiting less outgassing than a material forming the second attaching element, and the second attaching element may be formed of a more adhesive material than a material forming the first attaching element, the second attaching element having the exposed pores.

The pellicle may further include an adhesive between and contacting the pellicle membrane and the pellicle frame, the adhesive being disposed on a surface of the pellicle frame opposite the first and second attaching elements.

Embodiments are also directed to a lithography system, including a photomask; and a pellicle according to an embodiment attached to the photomask, the attaching element being interposed between the pellicle frame and the photomask, the first surface of the attaching element contacting the photomask.

Embodiments are directed to a method of detaching a pellicle from a photomask, the pellicle including an elastomer attaching element interposed between a pellicle frame and the photomask, the method including providing a detaching element at an extending portion of the attaching element, the extending portion being formed of the elastomer; and applying a force to the detaching element so as to pull the extending portion in a first direction having a vector component directed normal to the major surface of the photomask and directed toward a backside of the pellicle.

The first direction may also have a vector component directed parallel to a major surface of the photomask and directed away from a center region of the photomask.

The method may further include applying a force having a vector component directed normal to the major surface of the photomask and directed toward a backside of the pellicle using a forcing member inserted between the pellicle frame and the photomask.

The forcing member may be a lever, and a plurality of forcing members and a plurality of extending portions of the attaching element may be arranged symmetrically about the pellicle frame.

Embodiments are also directed to pellicle, including a pellicle frame configured to be adhered to a photomask substrate, an attaching element formed on one surface of the pellicle frame, which faces the photomask substrate, and a pellicle membrane formed on the other surface of the pellicle frame. The attaching element may have at least one primary structure that is formed on a surface of the attaching element, which faces the photomask substrate, and capable of generating negative pressure.

The attaching element may be an elastomer.

The attaching element may be selected from a group of a polyamide-based elastomer, an acrylate-based elastomer, a styrene-based elastomer, a polyolefin-based elastomer, a polyoxyalkylene-based elastomer, a polyester-based elastomer, an epoxy-based elastomer, a polyvinyl chloride (PVC)-based elastomer, a silicon-based elastomer, a fluorine-based elastomer, a nitrile-based elastomer, a polyurethane-based elastomer, a copolymer of an ethylene propylene diene monomer (EPDM), and a mixture thereof.

The attaching element may be combined with the pellicle frame by an adhesive layer.

The primary structure of the attaching element may include pores of which openings have an average diameter of about 0.1 µm to about 500 µm.

The primary structure of the attaching element may be irregularly arranged on the surface of the attaching element, which faces the photomask substrate.

The primary structure of the attaching element may be regularly arranged on the surface of the attaching element, which faces the photomask substrate.

The openings of the primary structure may be arranged in a lattice form.

The openings of the primary structure may have a polygonal shape.

The primary structure of the attaching element may further include a secondary structure that is recessed from an inner surface of the at least one primary structure.

The pellicle may further include a detachment assisting unit provided on at least one side of the attaching element and configured to detach the attaching element from the photomask substrate.

The detachment assisting unit may include a concave unit into which a detaching element is capable of being inserted.

The detachment assisting unit may include a protrusion unit, which protrudes in a lateral direction of the pellicle frame and causes deformation of the attaching element through application of external force.

The attaching element may include a first attaching element that extends along an inner edge of the pellicle frame, and a second attaching element that is disposed farther from the inner edge of the pellicle frame than the first attaching element and extends along the first attaching element.

The first attaching element and the second attaching element may be different materials.

The first attaching element may be a fluorine-based elastomer or a silicone-based elastomer, and the second attaching element may be a polyurethane-based elastomer.

The attaching element may include at least two different materials stacked in a direction in which the pellicle is attached.

The attaching element may include a third attaching element disposed closer to the pellicle frame and a fourth attaching element disposed farther from the pellicle frame. The fourth attaching element may have a lower hardness than the third attaching element.

The pellicle may be a pellicle for deep ultraviolet (DUV) lithography and/or a pellicle for extreme UV (EUV) lithography.

Embodiments are also directed to a photomask, including a photomask substrate having a pellicle region, and a pellicle attached to the photomask substrate to surround the pellicle region. The pellicle may include a pellicle frame, an attaching element formed on one surface of the pellicle frame, and a pellicle membrane formed on the other surface of the pellicle frame, and the attaching element configured to be capable of being attached and detached may be attached to the photomask substrate.

The attaching element may have a primary structure that is formed on a surface of the attaching element, which faces the photomask substrate, and capable of generating negative pressure.

The attaching element may remain attached to the photomask substrate due to the negative pressure generated by the primary structure and the van der Waals force between the attaching element and the photomask substrate.

The attaching element may be configured to be capable of being re-attached to the photomask substrate after the attaching element is detached from the photomask substrate.

The primary structure may be at least one micro-pore.

The at least one micro-pore may have a density of about $1\times10^6/cm^2$ to about $5\times10^9/cm^2$.

Embodiments are also directed to a method of attaching a pellicle, the method including preparing a photomask substrate having a pellicle region, preparing a pellicle including a pellicle frame, an attaching element formed on one surface of the pellicle frame, and a pellicle membrane formed on the other surface of the pellicle frame, disposing the pellicle in an attaching position of the photomask substrate to surround the pellicle region, tightly attaching the pellicle and the photomask substrate to each other by applying pressure to the pellicle, and removing the pressure. The attaching element may be configured to generate negative pressure between the attaching element and the photomask substrate when the attaching element is deformed due to the pressure and restored by removing the pressure.

The pressure may be applied onto the pellicle without application of heat to the pellicle.

The pellicle may be a pellicle that has been attached to another photomask substrate before the pellicle is attached to the photomask substrate.

The method may further include detaching the pellicle from the other photomask substrate before preparing the pellicle.

Embodiments are also directed to a method of detaching a pellicle, the method including preparing a photomask including a photomask substrate having a pellicle region and a pellicle attached to the photomask substrate to surround the pellicle region, the pellicle including a pellicle frame, an attaching element formed on one surface of the pellicle frame, a pellicle membrane formed on the other surface of the pellicle frame, and a detachment assisting unit configured to detach the attaching element from the photomask substrate, deforming the attaching element by applying force to the detachment assisting unit, and elevating the detachment assisting unit from the photomask substrate such that the pellicle is detached from the attaching element adjacent to the detachment assisting unit.

The detachment assisting unit may be a concave unit into which an external detaching element is capable of being inserted, and the deformation of the attaching element may include inserting the external detaching element into the detachment assisting unit.

The detachment assisting unit may protrude and extend from the attaching element in a lateral direction of the pellicle frame, and the deformation of the attaching element may include applying force to the protruding detachment assisting unit in a direction away from the photomask substrate.

The detachment assisting unit may be provided in plural and disposed in symmetrical positions about the pellicle frame.

BRIEF DESCRIPTION OF THE DRAWINGS

Features will become apparent to those of skill in the art by describing in detail example embodiments with reference to the attached drawings in which.

DETAILED DESCRIPTION

Figure 1:
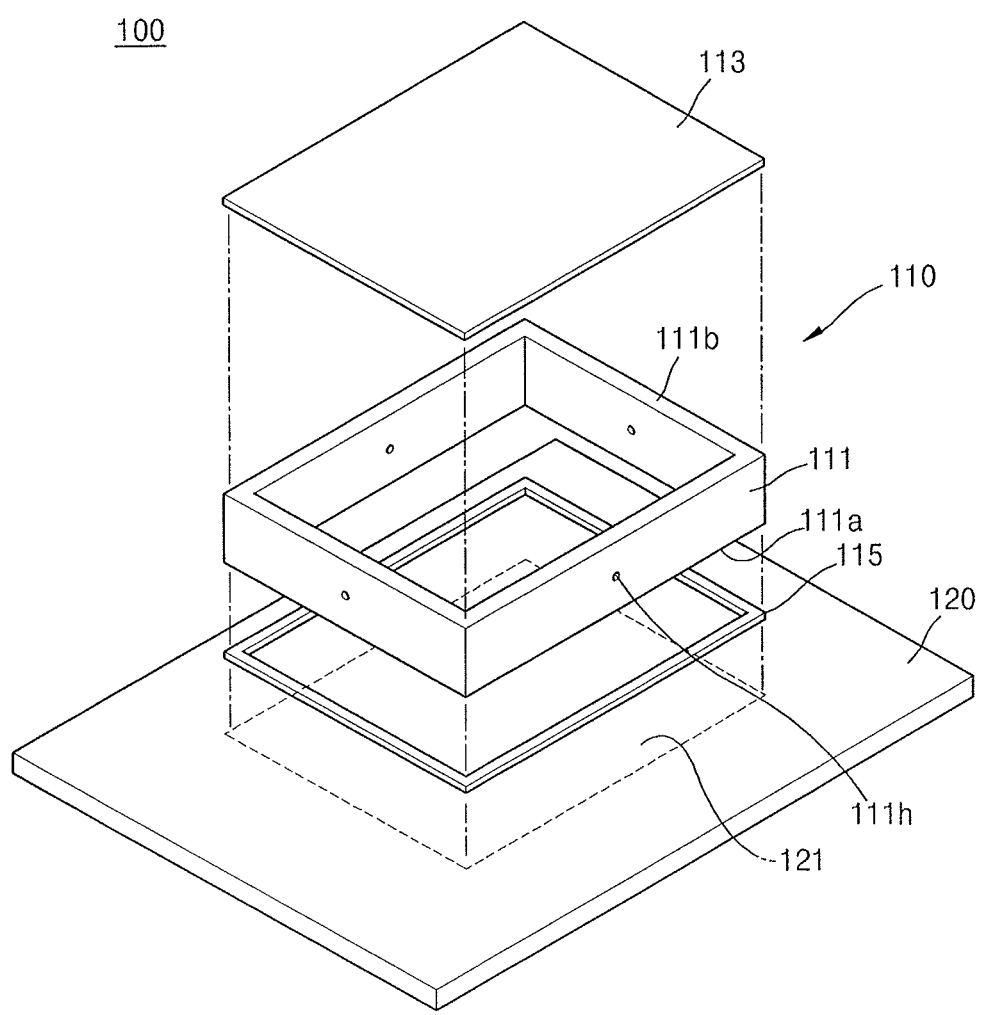
FIG. 1 illustrates an exploded perspective view of a pellicle according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration, and embodiments are not limited by the illustrated relative sizes or intervals. Like reference numerals refer to like elements throughout.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

As used herein, the term "and/or" includes any and all combinations of one or more of the associated listed items.

FIG. 1 illustrates an exploded perspective view of a pellicle 110 according to an example embodiment.

Referring to FIG. 1, the pellicle 110 may include a pellicle frame 111, an attaching element 115 formed on one surface of the pellicle frame 111, and a pellicle membrane 113 formed on the other surface of the pellicle frame 111.

The pellicle frame 111 may be configured to surround a predetermined region of a photomask substrate 120. The pellicle frame 111 may have, for example, a regular tetragonal shape or rectangular shape having two pairs of parallel sides. The pellicle frame 111 may have a size of, for example, 115 mm×149 mm, 474 mm×782 mm, 754 mm×902 mm, 330 mm×400 mm, 330 mm×450 mm, 390 mm×610 mm, 500 mm×750 mm, 520 mm×800 mm, 800 mm×920 mm, 850 mm×1200 mm, 1220 mm×1400 mm, or 1800 mm×2000 mm based on, for example, an outer length.

The pellicle frame 111 may be configured to surround a pellicle region 121 of the photomask substrate 120. The pellicle region 121 will be described in detail later.

The pellicle frame 111 may have a first surface 111a and a second surface 111b that are parallel to the photomask substrate 120. The first surface 111a of the pellicle frame 111 may be a surface that is disposed close to the photomask substrate 120 and faces the photomask substrate 120. The second surface 111b of the pellicle frame 111 may be a surface that is disposed far from the photomask substrate 120 and faces the pellicle membrane 113.

The pellicle frame 111 may be formed an aluminum alloy (JIS A7000-type aluminum alloy) containing aluminum and zinc, for example, an A7075-type aluminum alloy having a high strength. As another example, the pellicle frame 111 may be formed of an aluminum alloy (JIS A6000-type aluminum alloy) containing aluminum, magnesium, and silicon, for example, an A6061 aluminum alloy having good machinability. As another example, the pellicle frame 111 may be formed of an aluminum alloy (JIS A5000-type aluminum alloy) containing aluminum and magnesium, for example, an A5052 aluminum alloy.

A ventilation hole 111h may be formed in a sidewall of the pellicle frame 111 to prevent application of excessive pressure and equalize the pressure of the inside of the pellicle frame 111 to that of an external pressure. The ventilation hole 111h may have, for example, a circular shape. At least one ventilation hole 111h may be formed. Although FIG. 1 illustrates a case in which four ventilation holes 111h are formed, a smaller or greater number of ventilation holes 111h may be formed. An air filter having a mesh with a smaller size than a particle diameter of dirt to be blocked may be provided in the pellicle frame 111. For example, the air filter may prevent particles having a particle size of about 0.2 mm or more from passing therethrough.

The pellicle membrane 113 may dimensionally match the pellicle frame 111 and be attached onto the second surface 111b of the pellicle frame 111. The pellicle membrane 113 may be adhered onto the second surface 111b of the pellicle frame 111 by, for example, an adhesive layer.

The pellicle membrane 113 may cover an exposure region of a photomask to be manufactured by using the pellicle 110. Accordingly, the pellicle membrane 113 may have such transparency as to maximize transmission of optical energy during an exposure process. The pellicle membrane 113 may be formed of a highly transparent material, for example, quartz glass; sapphire; a fluorine-based resin such as an amorphous fluorine polymer; and a cellulose-based material such as nitrocellulose and cellulose acetate. For example, Teflon™ (DuPont) and Cytop™ (Asahi Glass) may be used as the amorphous fluorine polymer.

The adhesive layer by which the pellicle membrane 113 is fixed to the pellicle frame 111 may include a fluorine polymer, for example, an acryl resin adhesive, an epoxy resin adhesive, a silicon resin adhesive, or a fluorine-containing silicon resin adhesive. In particular, the adhesive layer may include a fluorine-based polymer.

The attaching element 115 may have a fine primary structure formed on at least a surface of the attaching element 115, which faces the photomask substrate 120.

Figure 2A:
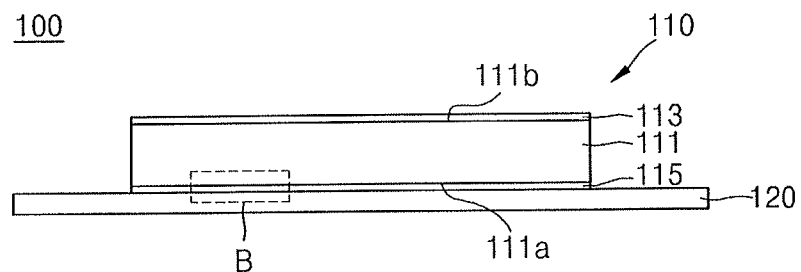
FIG. 2A illustrates a side view of the pellicle of FIG. 1.
Figure 2B:
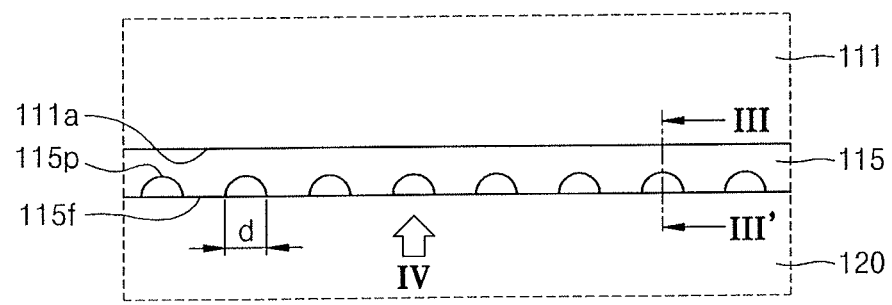
FIG. 2B illustrates a detailed enlarged view of region B of FIG. 2A.

FIG. 2A illustrates a side view of the photomask 100, and FIG. 2B is a detailed enlarged view of region B of FIG. 2A.

Referring to FIGS. 2A and 2B, the attaching element 115 may have a fine primary structure that is formed on the first surface 111a of the pellicle frame 111, which may face a photomask substrate 120. In FIG. 2B, sizes of elements may be exaggerated for clarity.

In an embodiment, the primary structure of the attaching element 115 may be an arbitrary structure capable of generating negative pressure therein. Here, the term 'negative pressure' refers to a pressure that is lower than in an outer atmosphere of a pellicle. When negative pressure is generated due to the primary structure between the attaching element 115 and the photomask substrate 120, the attaching element 115 may be tightly attached to the photomask substrate 120 due to force generated by a difference between pressure of the outer atmosphere of the pellicle and inner pressure of the primary structure.

A structure of the attaching element 115, which may be capable of generating negative pressure, may be, for example, a pore structure having an opening unit. A pore 115p may have one of various cross-sectional shapes. In particular, an inner volume of the pore 115p may be changed due to deformation of the attaching element 115.

When the attaching element 115 is pressed onto and tightly attached to the photomask substrate 120, the inner volume of the pore 115p may be reduced due to the deformation of the attaching element 115. Also, the attaching element 115 may be restored to an original form thereof by removing the pressing force so that the inner volume of the pore 115p may increase. In this case, since only the volume of the pore 115p increases while a gas present in the pore 115p has an equal mole number, inner pressure of the pore 115p may be reduced to generate negative pressure.

The pore 115p may be a micro-pore having a microscale dimension. An inlet of the pore 115p may have a circular shape, an elliptical shape, a polygonal shape, or other arbitrary shapes.

Also, when a diameter obtained by converting inlets of pores 115p into circles having the same area is defined as a characteristic diameter "d," the characteristic diameter "d" of the pore 115p may range from about 0.1 μm to about 500 μm on average. The characteristic diameter "d" may be obtained by processing the corresponding surface image by software. Accordingly, pores that are too fine to be detected during the image processing process may be excluded from the calculation of the average characteristic diameter "d."

Furthermore, the number (i.e., pore density) of pores 115p per unit area of the attaching element 115 may be controlled to be constant. For example, the pore density may range from about $1 \times 10^6 /cm^2$ to about $5 \times 10^9 /cm^2$. When the pore density is very low, the contribution of the pores 115p to the adhesion of the attaching element 115 to the photomask substrate 120 may be unsatisfactory. When the pore density is very high, the pores 115p may have an excessively small size. In this case, similar to the case in which the pore density is very low, the contribution of the pores 115p to the adhesion of the attaching element 115 to the photomask substrate 120 may be unsatisfactory.

FIG. 2B illustrates separate discrete pores 115p, but the pores 115p may be formed through the attaching element 115 and connected to one another.

The attaching element 115 may have a surface 115f that is tightly attached to a surface of the photomask substrate 120. The tightly-attached surface 115f and the photomask substrate 120 may contact each other at the molecular level and be attached to each other due to van der Waals force. Thus, the tightly-attached surface 115f may remain attached to the photomask substrate 120 due to van der Waals force generated by a close contact of the tightly-attached surface 115f with the photomask substrate 120.

The attaching element 115 may be attached to the photomask substrate 120 due to force generated by negative pressure formed in the primary structure and/or van der Waals force generated between the tightly-attached surface 115f and the photomask substrate 120.

According to the present example embodiment, the attaching of the attaching element 115 to the photomask substrate 120 does not occur due to a chemical combination. Thus, the attaching element 115 may be physically detached from the photomask substrate 120 without leaving residue on the surface of the photomask substrate 120 by re-deforming the attaching element 115 or by applying stress in a lateral direction.

Figure 3:
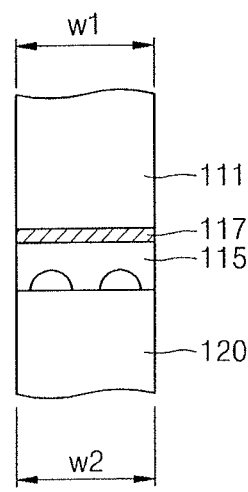
FIG. 3 illustrates a cross-sectional view taken along III-III' of FIG. 2B.

FIG. 3 illustrates a cross-sectional view taken along line III-III' of FIG. 2B.

Referring to FIG. 3, the attaching element 115 may be interposed between the pellicle frame 111 and the photomask substrate 120 so that the pellicle frame 111 may be physically combined with the photomask substrate 120.

A width W2 of the attaching element 115 may be less than or equal to a lateral thickness W1 of the pellicle frame 111. Also, although FIG. 3 illustrates the attaching element 115 as having a rectangular cross-sectional shape, the attaching element 115 may have various cross-sectional shapes. However, a surface of the attaching element 115, which contacts the pellicle frame 111, and a surface of the attaching element 115, which contacts the photomask substrate 120, may be plane surfaces to further improve airtightness.

As shown in FIG. 3, the attaching element 115 may maintain such airtightness as to cut off the flow of particles between the inside and outside of the pellicle frame 111.

The attaching element 115 may be attached to the pellicle frame 111 by using various methods. FIG. 3 illustrates an embodiment in which the attaching element 115 is combined with the pellicle frame 111 by an adhesive layer 117. The adhesive layer 117 may include a fluorine polymer, for example, an acryl resin adhesive, an epoxy resin adhesive, a silicon resin adhesive, or a fluorine-containing silicon resin adhesive. In particular, the adhesive layer 117 may include a fluorine-based polymer.

In other embodiments, the attaching element 115 may be fused by a heating process and attached to the pellicle frame 111.

In other embodiments, the attaching element 115 and the pellicle frame 111 may be attached to each other by modifying attached surfaces of the attaching element 115 and/or the pellicle frame 111. For example, surface energies of the attached surfaces of the attaching element 115 and/or the pellicle frame 111 may be changed by processing the attached surfaces of the attaching element 115 and/or the pellicle frame 111 by using plasma. Thus, when the attaching element 115 and the pellicle frame 111 are brought into contact with each other, the affinity of the attaching element 115 and the pellicle frame 111 for each other may be increased due to the changed surface energies. In other embodiments, the attached surfaces of the attaching element 115 and/or the pellicle frame 111 may be processed using chemicals instead of plasma.

Figure 4A:
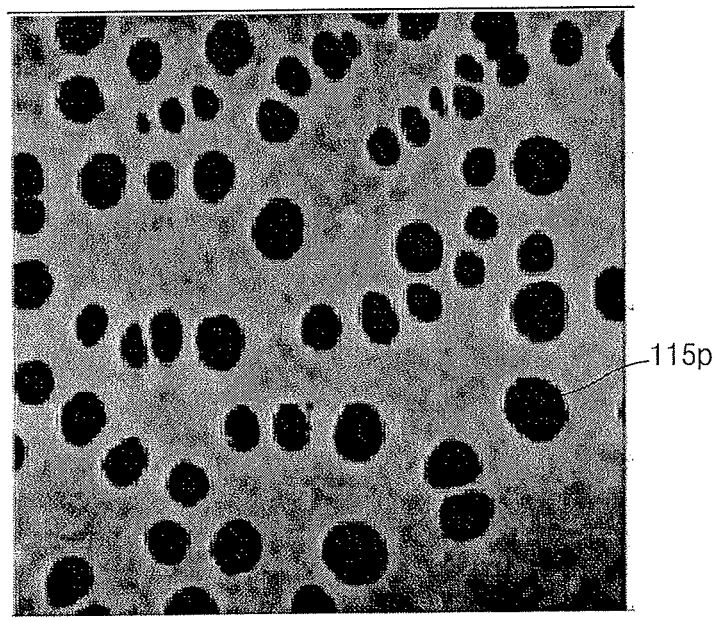
FIGS. 4A to 4C illustrate images of examples of shapes of surfaces of an attaching element when the attaching element is seen in the direction indicated by an arrow IV of FIG. 2B.
Figure 4B:
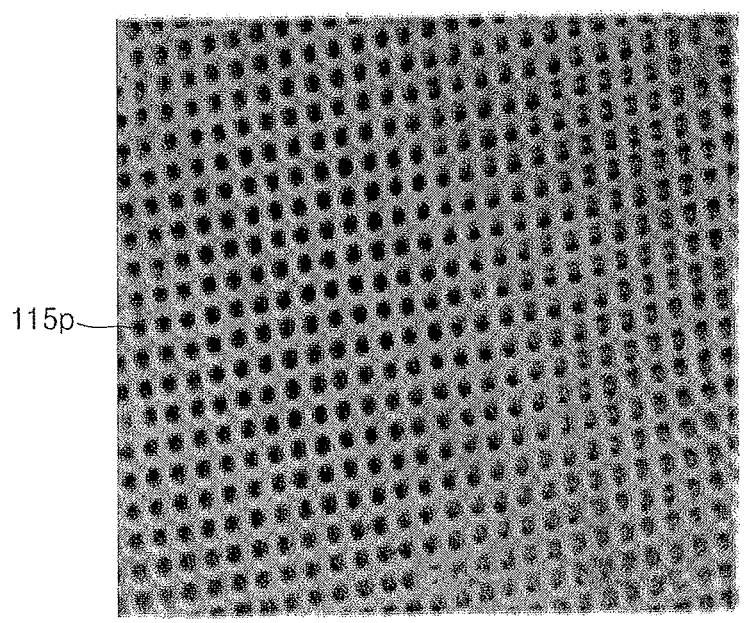
Figure 4C:
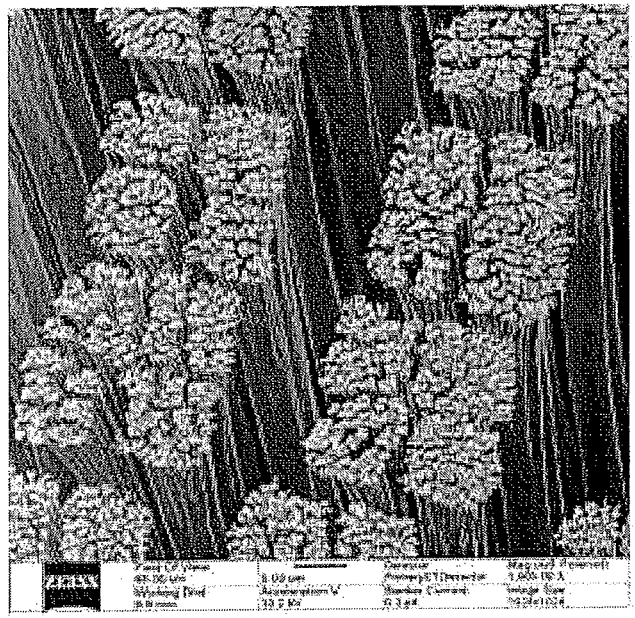

FIGS. 4A to 4C illustrate images of examples of shapes of surfaces of the attaching element 115 when the attaching element 115 is seen in the direction indicated by the arrow IV of FIG. 2B.

Referring to FIG. 4A, pores 115p may be irregularly arranged. Also, the pores 115p may have inlets with irregular sizes and have a predetermined distribution.

Referring to FIG. 4B, unlike in FIG. 4A, pores 115p may be regularly arranged. Also, the pores 115p may be arranged in a lattice form. Although FIG. 4B illustrates an example in which the pores 115p are arranged in a lattice form, the pores 115p may be arranged in other forms such as a honeycomb form.

Primary structures shown in FIGS. 4A and 4B may be obtained using various methods. For example, pores having irregular shapes, as shown in FIG. 4A, may be obtained from gas bubbles formed by gas by-products that are produced during the formation of the attaching element 115. Thus, when a source material for forming the attaching element 115 is selected, a material capable of generating gases in a process of obtaining a product may be selected, and the size of gas bubbles and frequency of occurrence of the gas bubbles may be controlled by adjusting a reaction temperature, a reaction pressure, and the concentration of a reactant. Thus, the density and inlet diameter (characteristic diameter) of the primary structures (i.e., the pores 115p) that are obtained from the gas bubbles may be controlled.

Figure 5A:
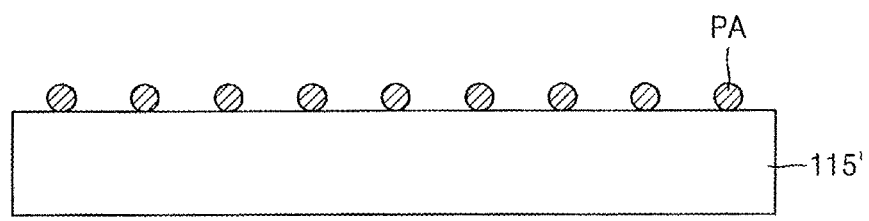
FIGS. 5A to 5C illustrate side cross-sectional views of sequential processes of a method of obtaining the arrangement of pores shown in FIGS. 4A and 4B, according to an example embodiment.
Figure 5B:
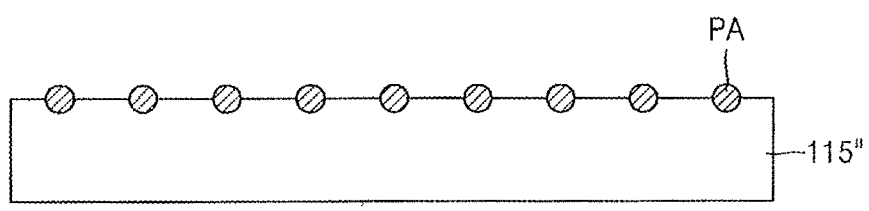
Figure 5C:
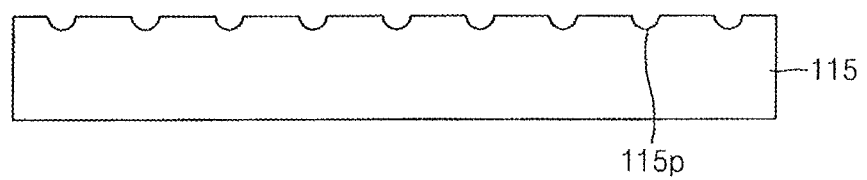

Optionally, an imprint method may be used to obtain the arrangement of the pores 115p shown in FIGS. 4A and 4B. FIGS. 5A to 5C are side cross-sectional views of sequential processes of the imprint method for obtaining the arrangement of the pores 115p shown in FIGS. 4A and 4B.

Referring to FIG. 5A, particles PA having an equal or similar size to the pores 115p may be distributed on a matrix 115' of the attaching element 115. When irregular arrangement of the pores 115p is desired, as shown in FIG. 4A, the particles PA may be irregularly arranged. Alternatively, when regular arrangement of the pores 115p is desired, as shown in FIG. 4B, the particles PA may be regularly arranged.

Referring to FIG. 5B, a reflowed matrix 115" may be formed by applying energy, such as heat or light, to the matrix 115'. Thus, the particles PA may be partially soaked in the reflowed matrix 115". An extent to which the particles PA are soaked in the reflowed matrix 115" may be controlled by adjusting a reflowing extent of the reflowed matrix 115'.

Next, the reflowed matrix 115" may be cured. The reflowed matrix 115" may be cured by, for example, adjusting a temperature or blocking irradiation light.

Referring to FIG. 5C, an attaching element 115 having pores 115p may be obtained by removing the particles PA by using a dissolution process. The particles PA may be dissolved using a solvent or an etchant capable of dissolving the particles PA.

In another example embodiment, the primary structures shown in FIG. 4B may be obtained using a photolithography process. For example, photoresist may be coated on a matrix of the attaching element 115, exposed along patterns, and developed to expose a portion of the matrix along the patterns. Next, a wet or dry etching process may be performed on the exposed portion of the matrix, thereby forming pores 115p that are regularly arranged.

FIG. 4C illustrates a plurality of cilia groups formed as primary structures on the surface of the attaching element 115 instead of pores. Optionally, nanocilia may be attached to respectively terminals of cilia that form the cilia groups.

Figure 6:
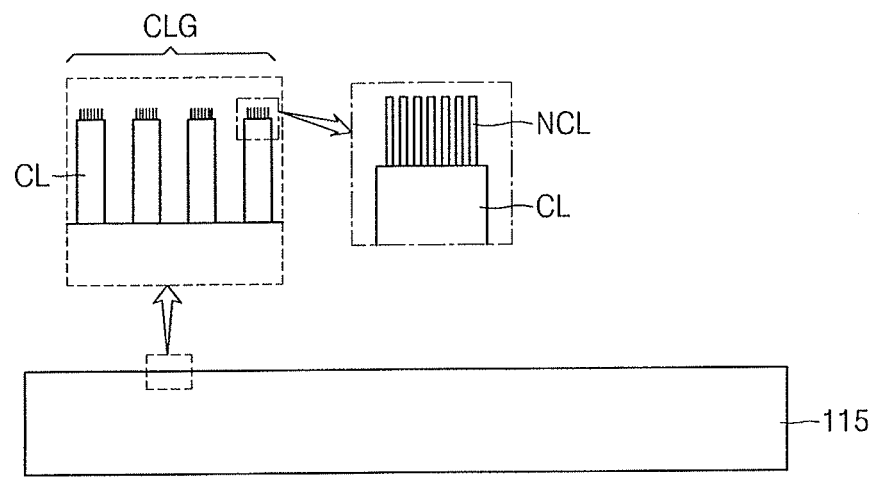
FIG. 6 illustrates a schematic side view for easily explaining a cilia group and nanocilia of FIG. 4C.

FIG. 6 illustrates a schematic side view for explaining a cilia group and nanocilia of FIG. 4C.

Referring to FIG. 6, like on the underside of a gecko's foot, a cilia group CLG, including a very large number of cilia CL, may be formed on the attaching element 115 so that strong van der Waals force can be applied between the attaching element 115 and the photomask substrate 120. Furthermore, nanocilia NCL may be further formed at an end of each of the cilia CL so that van der Waals force applied between the attaching element 115 and the photomask substrate 120 may be maximized.

For brevity, FIG. 6 illustrates a surface of the attaching element 115, which faces the photomask substrate 120, as facing upward.

Also, the attaching element 115 may be easily detached from the photomask substrate 120 by giving directionality to the cilia group CLG and/or the nanocilia NCL. For example, by adjusting the cilia group CLG and/or the nanocilia NCL to specific shapes or specific directions, when predetermined stress is applied to the attaching element 115, the attaching element 115 may be easily detached from the photomask substrate 120.

A material forming the attaching element 115 may be an elastomer. Here, the term "elastomer" refers to an arbitrary polymer or polymerized composition corresponding to a material that is capable of recovering from large deformation quickly and forcibly, and may be, or already is, modified to a state in which it is essentially insoluble (but can swell) in solvent as defined by ASTM D1566. The elastomer may be referred to as rubber. The elastomer used herein may have the same meaning as rubber.

For example, the elastomer may be, but is not limited to, a copolymer or mixture of a polyamide-based elastomer, an acrylate-based elastomer, a styrene-based elastomer, a polyolefin-based elastomer, a polyoxyalkylene-based elastomer, a polyester-based elastomer, an epoxy-based elastomer, a polyvinyl chloride (PVC)-based elastomer, a silicon-based elastomer, a fluorine-based elastomer, a polyurethane-based elastomer, a nitrile-based elastomer, an ethylene propylene diene monomer (EPDM) elastomer, etc.

The polyamide-based elastomer may be, for example, polyethylene adipic amide, polytetramethylene adipic amide, polyhexamethylene adipic amide, polyhexamethylene azelamide, polyhexamethylene sebacamide, polyhexamethylene undecamide, polyhexamethylene dodecanamide, polyhexamethylene terephthalamide, polyhexamethylene isophthalamide, polynonamethylene dodecanamide, polydecamethylene dodecanamide, polydodecamethylene dodecanamide, poly(m-xylene adipamide), polytrimethylhexamethylene terephthalamide (TMHT), poly-bis-(4-aminocyclohexyl) methanedodecanamide, poly-bis-(3-methyl-4-aminocyclohexyl) methanedodecanamide, polynonamethylene terephthalamide, polydecamethylene terephthalamide, polyundecamethylene terephthalamide, polydodecamethylene terephthalamide, or a copolymer thereof.

The acrylate-based elastomer may be, for example, a polymer or copolymer of acrylonitrile, ethacrylonitrile, methacrylonitrile, α-chloroacrylonitrile, β-chloroacrylonitrile, α-bromoacrylonitrile, acryl acid, methyl (meth)acrylate, ethyl (meth)acrylate, n-butyl (meth)acrylate, t-butyl (meth)acrylate, n-propyl (meth)acrylate, isopropyl (meth) acrylate, 2-ethylhexyl (meth)acrylate, isooctyl acrylate, 6-methyloctyl acrylate, 7-methyloctyl acrylate, or 6-methylheptyl acrylate.

The styrene-based elastomer may be, for example, a styrene-butadiene (SB) block copolymer, a styrene-ethylene/butadiene (SEB) block copolymer, a styrene-isoprene (SI) block copolymer, a styrene-ethylene-butadiene-styrene block copolymer (SEBS), a styrene-isoprene-styrene block copolymer (SIS), an acrylonitrile-butadiene-styrene block copolymer (ABS), an acrylonitrile-styrene-acrylate block copolymer (ASA), a styrene-isobutylene-styrene block copolymer (SIBS), a styrene-ethylene/propylene-styrene block copolymer (SEPS), a styrene-butadiene-styrene block copolymer (SBS), a styrene-based homopolymer, an α-methylstyrene-butadiene-α-methylstyrene block copolymer, an α-methylstyrene-isoprene-α-methylstyrene block copolymer, or a mixture thereof.

The polyolefin-based elastomer may be, for example, a polymer or copolymer of ethylene, propylene, 1-butene, 1-pentene, 3-methyl-1-butene, 1-hexene, 4-methyl-1-pentene, 3-methyl-1-pentene, 1-octene, 1-decene, 1-dodecene, 1-tetradecene, 1-hexadecene, 1-octadecene, and 1-eicosene, cyclopentene, cycloheptene, norbornene, 5-methyl-2-norbornene, tetracyclododecene, and 2-methyl-1,4,5,8-dimethano-1,2,3,4,4a,5,8,8a-octahydronaphthalene, butadiene, isoprene, 4-methyl-1,3-pentadiene, 1,3-pentadiene, 1,4-pentadiene, 1,5-hexadiene, 1,4-hexadiene, 1,3-hexadiene, 1,3-octadiene, 1,4-octadiene, 1,5-octadiene, 1,6-octadiene, 1,7-octadiene, ethylidene norbornene, vinyl norbornene, dicyclopentadiene, 7-methyl-1,6-octadiene, 4-ethylidene-8-methyl-1,7-nonadiene, and 5,9-dimethyl-1,4,8-decatriene; and 3-phenylpropene, 4-phenylpropene, 1,2-difluoroethylene, tetrafluoroethylene, or 3,3,3-trifluoro-1-propene.

The polyoxyalkylene-based elastomer may be, for example, polyoxymethylene, polyoxyethylene, polyoxypropylene, polyoxybutylene, polyoxytetramethylene, or a copolymer thereof.

For example, the polyester-based elastomer may be obtained by polymerizing at least one of terephthalic acid, isophthalic acid, phthalic acid, naphthalene-2,6-dicarbonic acid, naphthalene-2,7-dicarbonic acid, anthracenedicarbonic acid, diphenyl-4,4'-dicarbonic acid, diphenoxyethanedicarbonic acid, 4,4'-diphenyletherdicarbonic acid, 5-sulfoisophthalic acid, 3-sulfoisophthalic acid, 1,4-naphthalenedicarboxylic acid, 4,4'-biphenyldicarboxylic acid, 3,3'-biphenyldicarboxylic acid, 4,4'-methylenedibenzoic acid, 1,4-cyclohexane dicarbonic acid, cyclopentane dicarbonic acid, 4,4'-dicyclohexyldicarbonic acid, adipic acid, succinic acid, oxalic acid, sebacic acid, dodecanedioic acid, and dimer acid; and at least one of 1,4-butanediol, ethylene glycol, trimethylene glycol, pentamethylene glycol, hexamethylene glycol, neopentyl glycol, decamethylene glycol, 1,1-cyclohexane dimethanol, 1,4-dicyclohexane dimethanol, tricyclodecane dimethanol, xylene glycol, bis(p-hydroxy)diphenyl, bis(p-hydroxy)diphenylpropane, 2,2'-bis[4-(2-hydroxyethoxy)phenyl]propane, bis[4-(2-hydroxyethoxy)phenyl]sulfone, 1,1-bis[4-(2-hydroxyethoxy)phenyl]cyclohexane, 4,4'-dihydroxy-p-terphenyl, and 4,4'-dihydroxy-p-quarterphenyl. For example, the polyester-based elastomer may be polyethylene terephthalate, polyethylene naphthalate, or polyglycolic acid.

The PVC-based elastomer may be, for example, polyvinylidene chloride.

The epoxy-based elastomer may be, for example, bisphenol type (e.g., bisphenol A type, bisphenol F type, bisphenol S type, and hydrates thereof); novolac type (e.g., phenol novolac type or cresol novolac type); nitrogen-containing cyclic type (e.g. triglycidyl isocyanurate type or hydantoin type); alicyclic type; aliphatic type; aromatic type (e.g., naphthalene type or biphenyl type); glycidylamine type, such as glycidylamine type (e.g., N,N,O-triglycidyl-m-aminophenol, N,N,O-triglycidyl-p-aminophenol, N,N,O-triglycidyl-4-amino-3-methylphenol, N,N,N',N'-tetraglycidyl-4,4'-methylendianiline, N,N,N',N'-tetraglycidyl-2,2'-diethyl-4,4'-methylendianiline, N,N,N',N'-tetraglycidyl-m-xylylenediamine, N,N-diglycidylaniline, N,N-glycidyl-o-toluidine, glycidyl ether type, and glycidyl ester type; dicyclo type (e.g., di cyclopentadiene type); ester type; ether ester type, or a mixture thereof.

The silicon-based elastomer may be, for example, at least one of polydimethylsiloxane, polydiethylsiloxane, poly methyl ethyl siloxane, polymethylphenylsiloxane, polydiphenylsiloxane, polyvinylsiloxane, a dimethiconedimethicone/vinyl dimethicone crosspolymer, a dimethicone/vinyl dimethicone crosspolymer, a dimethicone crosspolymer, a dimethicone copolyol crosspolymer, polysilicon, a dimethicone/PEG crosspolymer, and a dimethicone/polyglycerin crosspolymer.

The fluorine-based elastomer may be, for example, polytrifluoroethylene, polytetrafluoroethylene, polychlorotrifluoroethylene, polyhexafluoropropylene, polyvinylidene fluoride, polyvinyl fluoride, polyethylene propylene fluoride, a tetrafluoroethylene-ethylene copolymer, a fluorovinylidene-hexafluoropropylene-tetrafluoroethylene terpolymer, fluorovinylidene-based rubber, tetrafluoroethylene-propylene rubber, tetrafluoroethylene-perfluoromethyl vinyl ether rubber, phosphazene-based fluorine rubber, fluoropolyether, fluoronitroso rubber, perfluorotriazine, or copolymers thereof.

The EPDM elastomer may be, for example, a copolymer of ethylene, propylene, and at least one of direct-chain non-cyclic diene (e.g., 1,4-hexadiene, 1,6-octadiene, 1,7-octadiene, and 1,9-decadiene); branched non-cyclic diene (e.g., 5-methyl-1,4-hexadiene, 3,7-dimethyl-1,6-octadiene, 3,7-dimethyl-1,7-octadiene, and mixed isomers of dihydromyrcene and dihydroocimene; monoalicyclic diene (e.g., 1,3-cyclopentadiene, 1,4-cyclohexadiene, 1,5-cyclooctadiene, and 1,5-cyclododecadiene); multi-ring alicyclic fused and bridged ring diene (e.g., tetrahydroindene, methyl tetrahydroindene, 5-ethylidene-2-norbornene (ENB), 5-vinylidene-2-norbornene (VNB), dicyclopentadiene (DCPD), and bicyclo-(2,2,1)-hepta-2,5-diene); alkenyl; alkylidene; cycloalkenyl; and cycloalkylidene norbornene (e.g., 5-methylene-2-norbornene (MNB), 5-prophenyl-2-norbornene, 5-isopropylidene-2-norbornene, 5-(4-cyclopentenyl)-2-norbornene, 5-cyclohexylidene-2-norbornene, 5-vinyl-2-norbornene, and norbornadiene).

The nitrile-based elastomer may be, for example, a copolymer of a diene monomer and unsaturated nitrile. The diene monomer may be an arbitrary monomer containing two conjugated or unconjugated carbon-carbon double bonds. In particular, an arbitrary conjugated diene monomer having 4 to 12 carbon atoms may be one selected from the group of isoprene, 1,3-butadiene, 2-methyl-1,3-butadiene, 2-ethyl-1, 3-butadiene, 2-phenyl-1,3-butadiene, 1-methylbutadiene, 2-methylbutadiene, 2,3-dimethyl-1,3-butadiene, 2,4-dimethyl-1,3-butadiene, 1,3-pentadiene, 1,4-pentadiene, 2-methyl-1,3-pentadiene, 3-methyl-1,3-pentadiene, 4-methyl-1,3-pentadiene, 2,3-dimethyl-1,3-pentadiene, dicyclopentadiene, tricyclopentadiene, 1,3-hexadiene, 1,4-hexadiene, 1,5-hexadiene, 2-methyl-1,5-hexadiene, 2-methyl-1,3-hexadiene, 2,5-dimethyl-1,3-hexadiene, 3-methyl-1,3-hexadiene, 4-methyl-1,3-hexadiene, 5-methyl-1,3-hexadiene, 2,5-dimethyl-1,3-hexadiene, 2-neopentylbutadiene, 1,3-cyclopentadiene, 1,3-cyclohexadiene, 1-vinyl-1,3-cyclohexadiene, 1,7-octadiene, 8-methyl-4-ethylidene-1,7-octadiene, 1,9-octadecadiene, vinyl norbornene, 5-ethylidene-2-norbornene, 5-methylene-2-norbornene, norbornadiene, 5-(5-hexenyl)-2-norbornene, 1,2-heneicosadiene, and a mixture of the above-described monomers.

The unsaturated nitrile may be, for example, acetonitrile, propionitrile, butyronitrile, isobutyronitrile, valeronitrile, isovaleronitrile, lauronitrile, 2-methylbutyronitrile, trimethylacetonitrile, hexanenitrile, cyclopentanecarbonitrile, cyclohexanecarbonitrile, acrylonitrile, methacrylonitrile, crotononitrile, 3-methylcrotononitrile, 2-methyl-2-buteneitrile, 2-pentenenitrile, 2-methyl-2-pentenenitrile, 3-methyl-2-pentenenitrile, 2-hexenenitrile, fluoroacetonitrile, difluoroacetonitrile, trifluoroacetonitrile, 2-fluoropropionitrile, 3-fluoropropionitrile, 2,2-difluoropropionitrile, 2,3-difluoropropionitrile, 3,3-difluoropropionitrile, 2,2,3-trifluoropropionitrile, 3,3,3-trifluoropropionitrile, 3,3'-oxydipropionitrile, 3,3'-thiodipropionitrile, 1,2,3-propanetricarbonitrile, 1,3,5-pentanetricarbonitrile, pentafluoropropionitrile; malononitrile, succinonitrile, glutaronitrile, adiponitrile, pimelonitrile, suberonitrile, azelanitrile, sebaconitrile, undecanedinitrile, dodecanedinitrile, methylmalononitrile, ethylmalononitrile, isopropylmalononitrile, tert-butylmalononitrile, methylsuccinonitrile, 2,2-dimethylsuccinonitrile, 2,3-dimethylsuccinonitrile, 2,3,3-trimethylsuccinonitrile, 2,2,3,3-tetramethylsuccinonitrile, 2,3-diethyl-2,3-dimethylsuccinonitrile, 2,2-diethyl-3,3-dimethylsuccinonitrile, bicyclohexyl-1,1-dicarbonitrile, cyclohexyl-2,2-dicarbonitrile, bicyclohexyl-3,3-dicarbonitrile, 2,5-dimethyl-2,5-hexanedicarbonitrile, 2,3-diisobutyl-2,3-dimethylsuccinonitrile, 2,2-diisobutyl-3,3-dimethylsuccinonitrile, 2-methylglutaronitrile, 2,3-dimethylglutaronitrile, 2,4-dimethylglutaronitrile, 2,2,3,3-tetramethylglutaronitrile, 2,2,4,4-tetramethylglutaronitrile, 2,2,3,4-tetramethylglutaronitrile, 2,3,3,4-tetramethylglutaronitrile, maleonitrile, fumaronitrile, 1,4-dicyanopentane, 2,6-dicyanoheptane, 2,7-dicyanooctane, 2,8-dicyanononan, 1,6-dicyanodecane, 1,2-dicyanobenzene, 1,3-dicyanobenzene, 1,4-dicyanobenzene, 3,3'-(ethylenedioxy)dipropionitrile, 3,3'-(ethylenedithio)dipropionitrile, cyclohexanetricarbonitrile, triscyanoethylamine, triscyanoethoxypropane, tricyanoethylene, pentanetricarbonitrile, propanetricarbonitrile, or heptanetricarbonitrile.

Although examples of materials forming the attaching element 115 have been described above, embodiments are not limited thereto.

Furthermore, elastomers forming the attaching element 115 may have a number average molecular weight (Mn) of about 5000 g/mol to about 500000 g/mol. The elastomers may have an Mn of about 7000 g/mol to about 400000 g/mol. The Mn may be measured by gel permeation chromatography (GPC) using polystyrene as a standard.

Figure 7A:
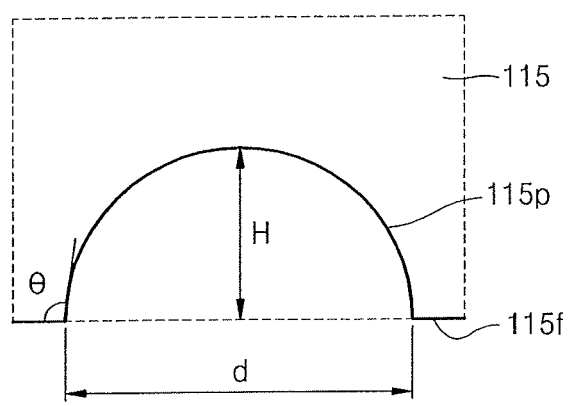
FIGS. 7A to 7C illustrate conceptual diagrams of various modified examples of a pore.
Figure 7B:
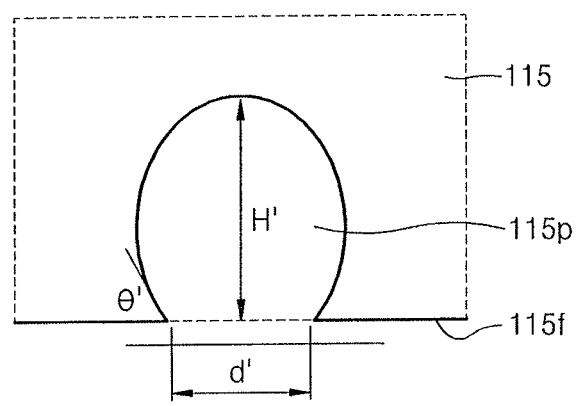
Figure 7C:
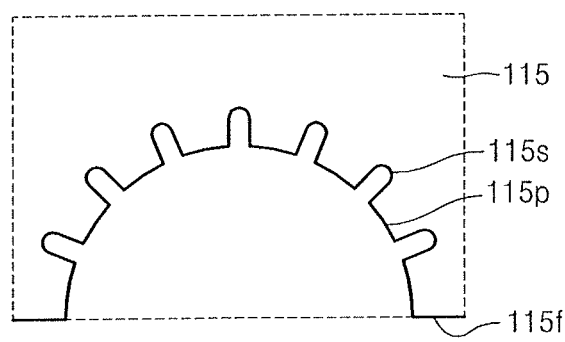

FIGS. 7A to 7C illustrate diagrams of various modified examples of a pore 115p.

Referring to FIG. 7A, assuming that a characteristic diameter of an inlet of the pore 115p is "d" and a depth of the pore 115p is H, an aspect ratio of the pore 115p may be defined by H/d. In the present embodiment, the characteristic diameter "d" of the inlet of the pore 115p may be greater than the depth H of the pore 115p. Accordingly, the aspect ratio H/d may be less than 1.

Furthermore, an angle θ formed by a tightly-attached surface 115f, which is tightly attached to a photomask substrate 120, with a tangent line to the inlet of the pore 115p may be larger than about 90°.

Referring to FIG. 7B, a characteristic diameter d' of an inlet of the pore 115p may be less than a depth H' of the pore 115p. Accordingly, an aspect ratio H'/d' may be greater than 1.

Furthermore, an angle θ' formed by the tightly-attached surface 115f, which is tightly attached to the photomask substrate 120, with the tangent line to the inlet of the pore 115p may be less than 90°.

In a different embodiment from that shown in FIGS. 7A and 7B, an aspect ratio of the pore 115p may be less than 1, and an angle θ formed by the tightly-attached surface 115f, which is tightly attached to the photomask substrate 120, with the tangent line to the inlet of the pore 115p may be less than 90°. Conversely, the aspect ratio of the pore 115p may be less than 1, and the angle θ may be less than 90°.

Referring to FIG. 7C, nanopores 115s, which form secondary structures, may be further formed in an inner surface of the pore 115p that may form the primary structure. The pore 115p may have a dimension of about several mm to several hundreds of mm, and the nanopores 115s may have a dimension of about several tens of nm to several hundreds of nm.

When the nanopores 115s that form the secondary structures are formed, a suction cup effect caused by negative pressure may be further reinforced so that the pellicle 110 may be attached to the photomask substrate 120 more effectively.

Figure 8:
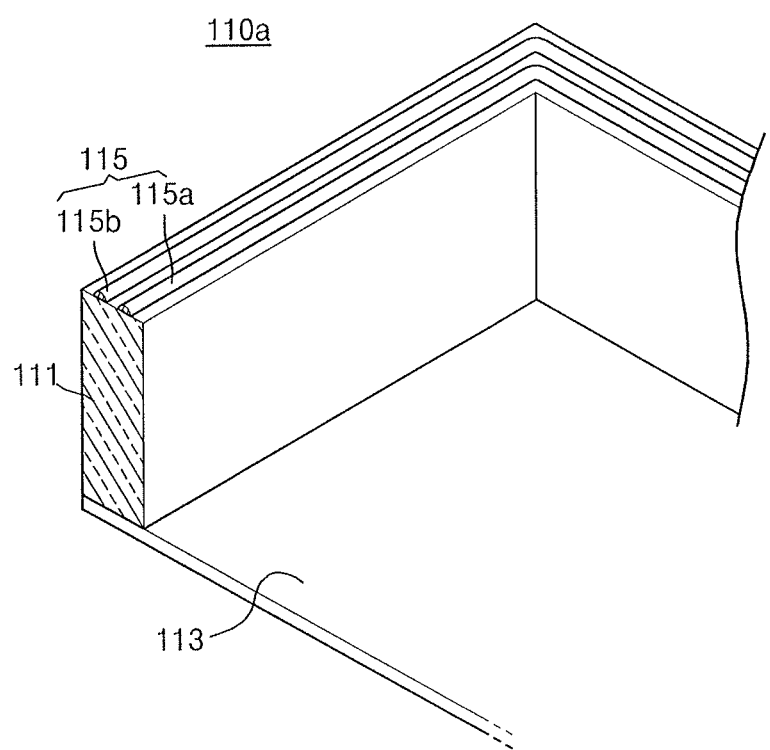
FIGS. 8 and 9 illustrate partial perspective cross-sectional views of pellicle according to other example embodiments.

FIG. 8 illustrates a partial perspective view of a pellicle 110a according to another example embodiment.

Referring to FIG. 8, an attaching element 115 may be formed in two lines on a first surface frame 111a of a pellicle frame 111. For example, the attaching element 115 may include a first attaching element 115a, which may extend along an inner edge of the pellicle frame 111, and a second attaching element 115b, which may be disposed farther from the inner edge of the pellicle frame 111 than the first attaching element 115a and extend along the first attaching element 115a.

Thus, the first attaching element 115a may be adjacent to the inner edge of the pellicle frame 111 and extend along the inner edge of the pellicle frame 111. The second attaching element 115b may be adjacent to an outer edge of the pellicle frame 111 and extend along the outer edge of the pellicle frame 111.

The first attaching element 115a and the second attaching element 115b may be formed of the same material or different materials.

When the first attaching element 115a and the second attaching element 115b are formed of different materials, the first attaching element 115a that is disposed more inward than the second attaching element 115b may be formed of a material capable of causing less outgassing than a material forming the second attaching element 115b. In this case, the second attaching element 115b that is disposed more outward than the first attaching element 115a may be formed of a more adhesive material than a material forming the first attaching element 115a.

For example, the first attaching element 115a may be a fluorine-based elastomer or a silicon-based elastomer, and the second attaching element 115b may be a polyurethane-based elastomer.

Figure 9:
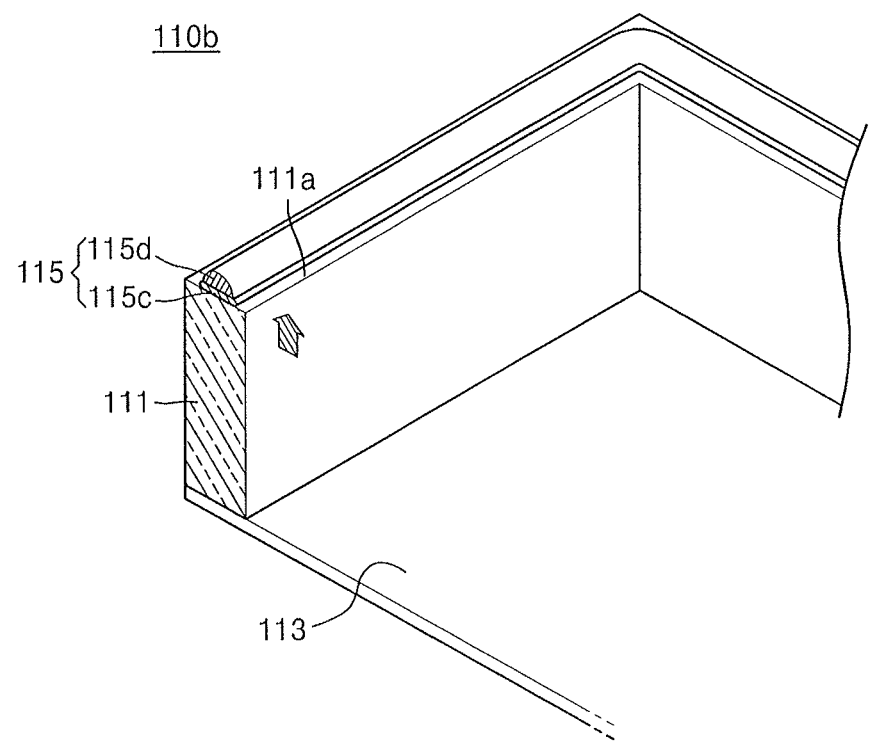

FIG. 9 illustrates a partial perspective cross-sectional view of a pellicle 110b according to another example embodiment.

Referring to FIG. 9, an attaching element 115 may include a third attaching element 115c and a fourth attaching element 115d that are sequentially stacked on a first surface 111a of the pellicle frame 111 in a direction (refer to an arrow) in which the pellicle 110b is attached. Thus, the third attaching element 115c may be formed close to the first surface 111a of the pellicle frame 111, and the fourth attaching element 115d may be formed on the third attaching element 115c to be close to the photomask substrate 120.

The third attaching element 115c and the fourth attaching element 115d may be formed of the same material or different materials.

In this case, when the third attaching element 115c and the fourth attaching element 115d are formed of different materials, the third attaching element 115c may be a material having a lower hardness than a material forming the fourth attaching element 115d.

By disposing the material having a lower hardness than the material forming the third attaching element 115c, the attaching element 115 may effectively adjust to uneven surface of the photomask substrate 120.

For instance, the third attaching element 115c may be a fluorine-based elastomer or a styrene-based elastomer, and the fourth attaching element 115d may be a silicone-based elastomer.

Figure 10A:
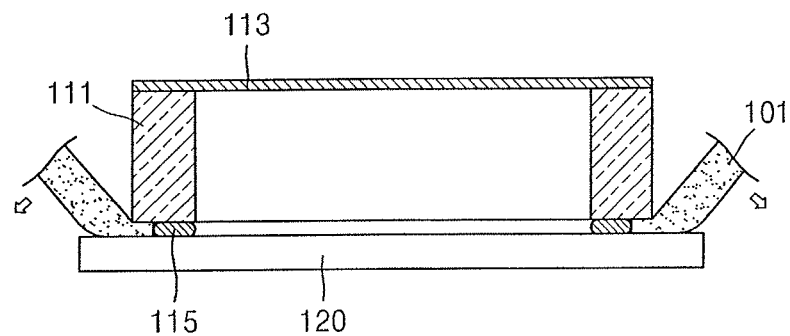
FIGS. 10A and 10B are conceptual diagrams of a method of detaching a pellicle, according to an example embodiment.
Figure 10B:
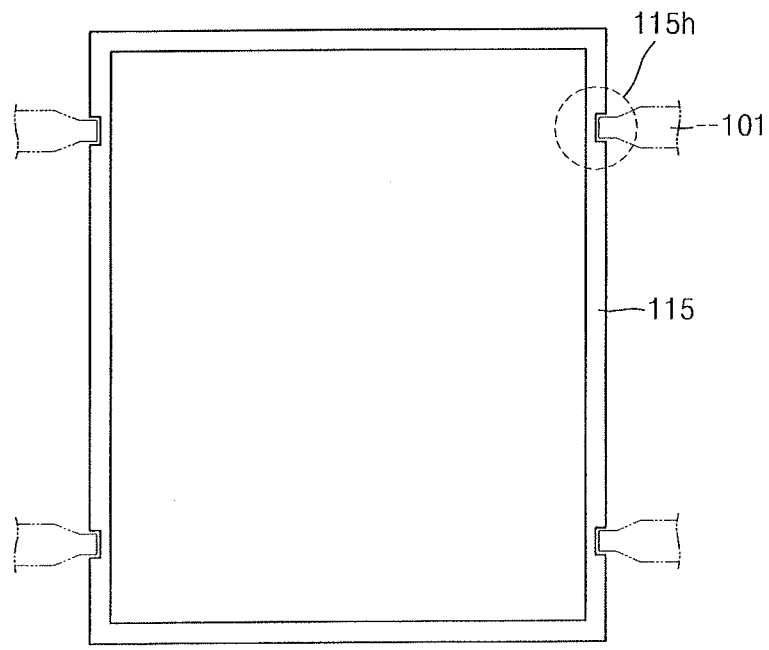

FIGS. 10A and 10B illustrate conceptual diagrams of a method of detaching a pellicle 110, according to an example embodiment.

Referring to FIGS. 10A and 10B, a detachment assisting unit 115h may be formed in an attaching element 115. More specifically, as shown in FIG. 10A, after the detaching element 101 is inserted between the pellicle frame 111 and the photomask substrate 120, when force is applied in a direction away from the pellicle frame 111, an inserted end portion of the detaching element 101 may be elevated based on the principle of the lever. As a result, the pellicle frame 111 may be also elevated due to the elevated end portion of the detaching element 101. Finally, the pellicle frame 111 may be separated from the photomask substrate 120.

When the detaching element 101 is used on only one side of the pellicle frame 111, the pellicle frame 111 may be minutely deformed so that the pellicle membrane 113 may be damaged. Accordingly, as shown in FIG. 10B, a plurality of detachment assisting units 115h may be provided in a plurality of locations. Furthermore, the plurality of detachment assisting units 115h may be symmetrically disposed about the pellicle frame 111.

FIG. 10B illustrates a case in which the respective detaching assisting units 115h are disposed symmetrically about an imaginary line passing the center of the pellicle frame 111, but the detaching assisting units 115h may be disposed symmetrically about a point of center of gravity of the pellicle frame 111.

Referring to FIG. 10A, when force is applied to the detaching element 101 in an outward direction, the pellicle frame 111 may be minutely elevated so that the attaching element 115 may be deformed. In this case, a portion of the attaching element 115, which is adjacent to the detaching element 101, may be deformed to the largest extent.

As additional forces are gradually applied to the detaching element 101, the attaching element 115 may be further deformed with the elevation of the pellicle frame 111. Only after a specific critical point, the attaching element 115 may start to be separated from the photomask substrate 120. In this case, a position of the attaching element 115, which starts to be separated from the photomask substrate 120, may be a position of the attaching element 115, which is deformed to the largest extent.

Once the attaching element 115 starts to be separated from the photomask substrate 120, the separation of the attaching element 115 from the photomask substrate 120 may propagate to portions adjacent to a portion from which the separation of the attaching element 115 starts. Finally, the whole attaching element 115 may be separated from the photomask substrate 120.

Figure 11A:
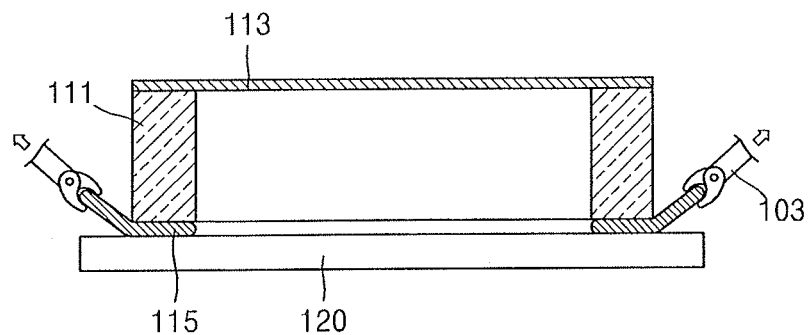
FIGS. 11A and 11B illustrate conceptual diagrams of a method of detecting a pellicle, according to another example embodiment.
Figure 11B:
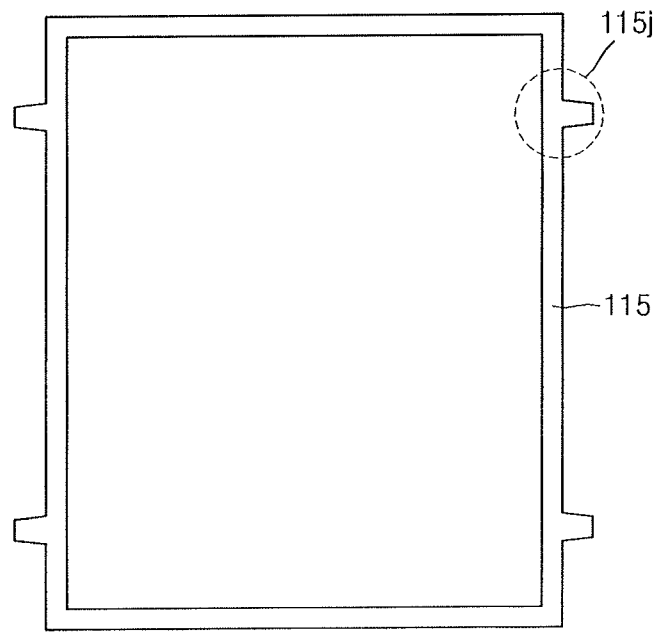

FIGS. 11A and 11B illustrate schematic diagrams of a method of detaching a pellicle 110, according to another example embodiment.

Referring to FIGS. 11A and 11B, it can be seen that detachment assisting units 115j protrude outward more than a pellicle frame 111.

In addition, detaching elements 103 may be configured to apply force to the protruding detachment assisting units 115j. For example, the detaching elements 103 may be configured to be capable of pinching the protruding detachment assisting units 115j. However, embodiments are not limited thereto.

The detachment assisting units 115j may be disposed in similar locations to the detachment assisting units 115h of FIGS. 10A and 10B.

When the detaching elements 103 directly apply force to the detachment assisting units 115j, the attaching elements 115 formed of an elastomer material may be deformed centering around the detachment assisting units 115j. In this case, when a direction in which force is applied to the detachment assisting units 115j is inclined outwards, outer edges of portions of the detachment assisting units 115j, which are in contact with the photomask substrate 120, may be highly likely detached.

When force is continuously applied in the direction shown in FIG. 11A, the separation of the attaching element 115 from the photomask substrate 120 may propagate from the outer edges of the portions of the detachment assisting units 115j to portions adjacent to the outer edges thereof. As a result, the whole attaching element 115 may be separated from the photomask substrate 120.

The methods of detaching the pellicle 110 shown in FIGS. 10A, 10B, 11A, and 11B may be used interchangeably.

Figure 12:
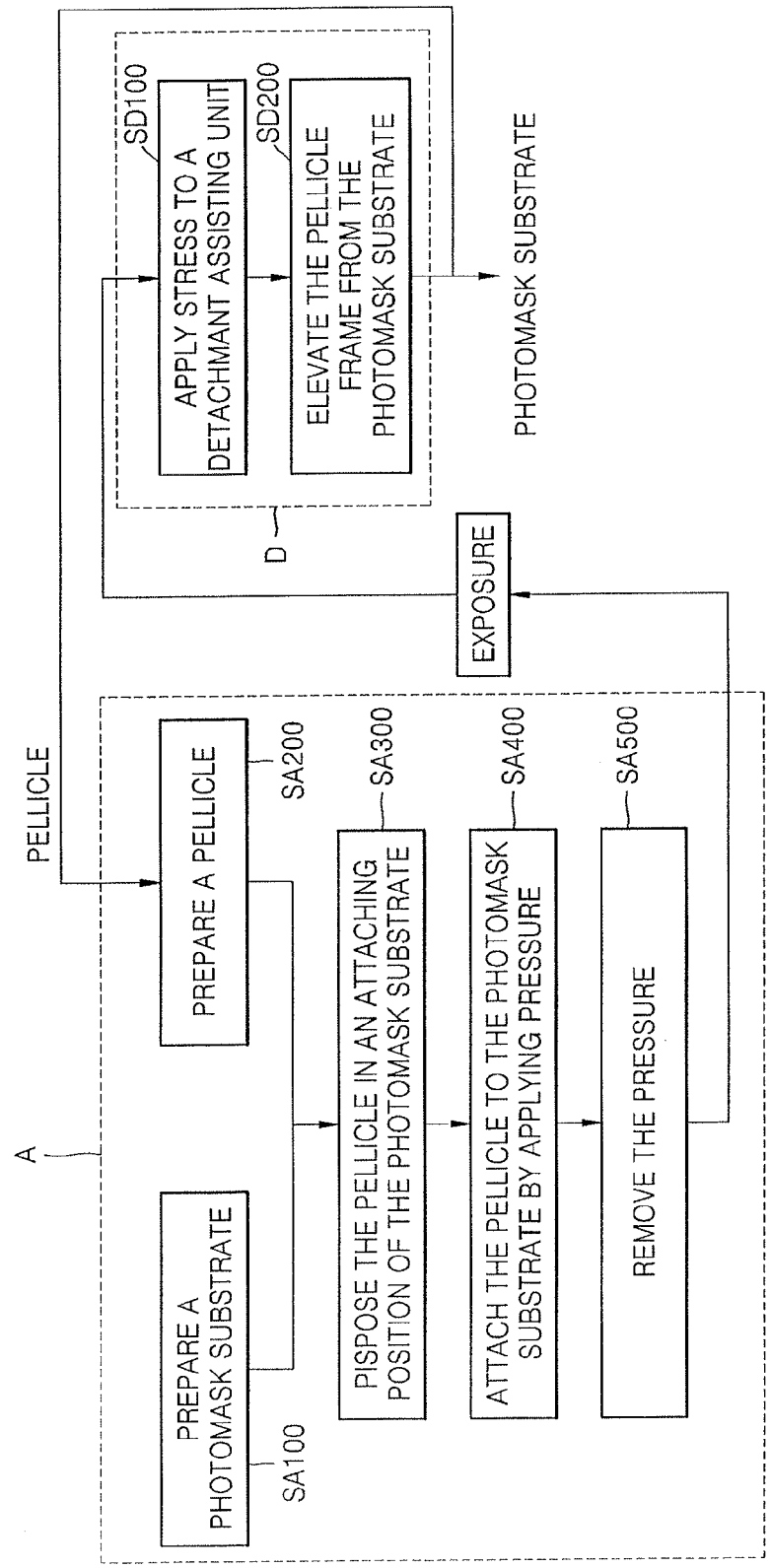
FIG. 12 illustrates a flowchart illustrating a method A of attaching a pellicle to a photomask substrate and a method D of detaching the pellicle from the photomask substrate.
Figure 13A:
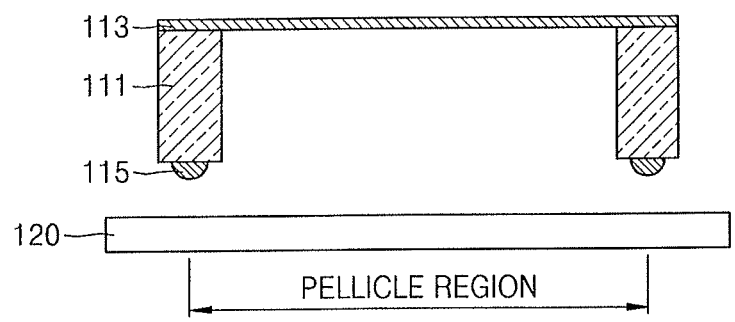
FIGS. 13A to 13C illustrate side cross-sectional views of sequential processes of a method of attaching a pellicle to a photomask substrate.
Figure 13B:
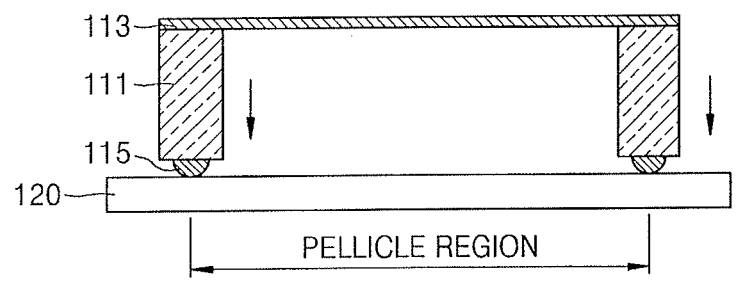
Figure 13C:
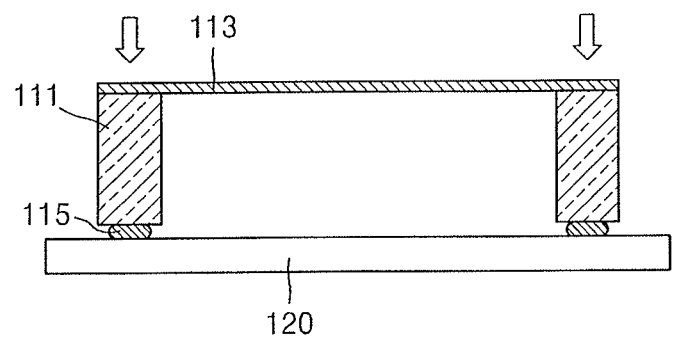

FIG. 12 illustrates a flowchart illustrating a method A of attaching a pellicle 110 to a photomask substrate 120 and a method D of detaching the pellicle 110 from the photomask substrate 120. FIGS. 13A to 13C are side cross-sectional views of sequential processes of a method of attaching a pellicle 110 to a photomask substrate 120.

Referring to FIGS. 12 and 13A, a photomask substrate 120 having a pellicle region may be prepared (SA100). Also, a pellicle 110 to be combined with the pellicle region of the photomask substrate 120 may be prepared (SA200). Since each of the pellicle 110 and the photomask substrate 120 has been described above in detail, repeated descriptions thereof are omitted here.

The operation SA100 of preparing the photomask substrate 120 and the operation of SA200 of preparing the pellicle 110 may not be performed in a specific sequential order but performed at the same time. Also, the pellicle 110 may be transferred to an appropriate location on the photomask substrate 120.

Referring to FIGS. 12 and 13B, the pellicle 110 may be disposed in an attaching position of the photomask substrate 120 to surround the pellicle region (SA300).

Referring to FIGS. 12 and 13C, the pellicle 110 may be tightly attached to the photomask substrate 120 by applying pressure onto the pellicle 110 (SA400). Although FIG. 13C illustrates a case in which the pressure is applied in a direction from the pellicle 110 toward the photomask substrate 120, pressure may be applied in an opposite direction. In particular, it may be unnecessary to apply heat unlike the case in which a pellicle is combined with a photomask substrate by using an adhesive.

With the application of the pressure, the deformation of the attaching element 115 may occur as shown in FIG. 13C.

Thereafter, when the pressure is removed, the attaching element 115 may be restored to an original form thereof. Thus, the attaching element 115 and the photomask substrate 120 may be attached to each other (SA500). Since a principle on which the attaching element 115 and the photomask substrate 120 are attached to each other by deforming and restoring the attaching element 115 has been described in detail above, repeated descriptions thereof are omitted here.

As explained thus far, a photomask, to which a pellicle is attached, may be loaded into an exposure apparatus and used for an exposure process as described in detail later.

When a change of pellicles is needed, a pellicle may be separated from a photomask substrate. Hereinafter, a method of detaching the pellicle will be described.

As shown in FIG. 13C, it is assumed that a photomask including the pellicle includes a photomask substrate and a pellicle attached to a pellicle region of the photomask substrate. In particular, it is assumed that the pellicle includes a pellicle frame, an attaching element formed on one surface of the pellicle frame, a pellicle membrane formed on the other surface of the pellicle frame, and a detachment assisting unit configured to detach the attaching element from the photomask substrate.

Referring to FIGS. 12 and 10B, a detaching element 101 may be inserted into a detachment assisting unit 115h, and force may be applied in a direction away from the pellicle frame 111 (SD100). As a result, as described with reference to FIGS. 10A and 10B, portions of the pellicle frame 111 and the attaching element 115, which are adjacent to the detachment assisting unit 115h, may start to be minutely deformed.

Figure 14:
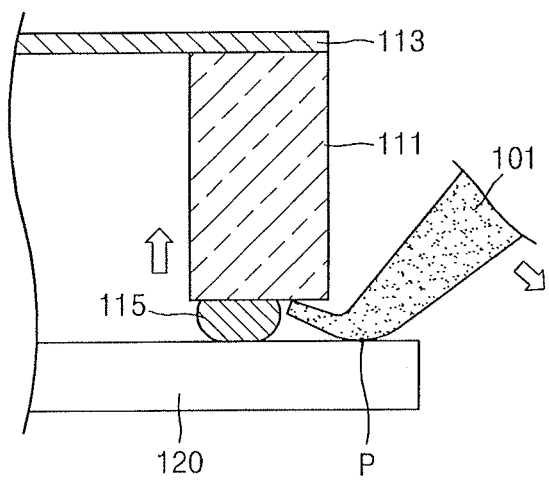
FIG. 14 illustrates a side view showing an instant that a pellicle frame starts to be elevated due to an end portion of a detaching element when the attaching element starts to be detached from the photomask substrate.

Furthermore, as the deformation of the portions of the pellicle frame 111 and the attaching element 115 proceeds, the attaching element 115 may start to be detached from a photomask substrate 120. FIG. 14 is a side view showing an instant that the pellicle frame 111 starts to be elevated due to an end portion of the detaching element when the attaching element 115 starts to be detached from the photomask substrate 120.

Referring to FIGS. 12 and 14, the pellicle frame 111 may be elevated due to the end portion of the detaching element 101 in a direction away from the photomask substrate 120 (SD200). As a result, a shape of the attaching element 115 may be different than when the attaching element 115 is attached to the photomask substrate 120.

Also, when force is continuously applied to the detaching element 101, the pellicle frame 111 may be continuously elevated due to the end portion of the detaching element 101. Finally, the pellicle frame 111 may be separated and detached from the photomask substrate 120.

In a case in which the pellicle 110 and the photomask substrate 120 are combined using an adhesive, it may be necessary to apply heat to separate the pellicle 110 from the photomask substrate 120. In contrast, according to the present example embodiment, it may be unnecessary to apply heat to separate the pellicle 110 from the photomask substrate 120. Also, when using an adhesive, residue of the adhesive remains on the photomask substrate 120, and chemicals including sulfuric acid are used to remove the residue. The chemicals may damage patterns formed on the photomask substrate 120. However, according to the present example embodiment, since the pellicle 110 is not attached onto the photomask substrate 120 by using an adhesive, the pellicle 110 may be easily detached from the photomask substrate 120 without leaving residue.

Furthermore, the detached pellicle 110 may be reused. Thus, the pellicle 110 detached from the photomask substrate 120 may be attached onto a new photomask substrate and used. Thus, costs taken to manufacture a pellicle may be greatly reduced.

Figure 15:
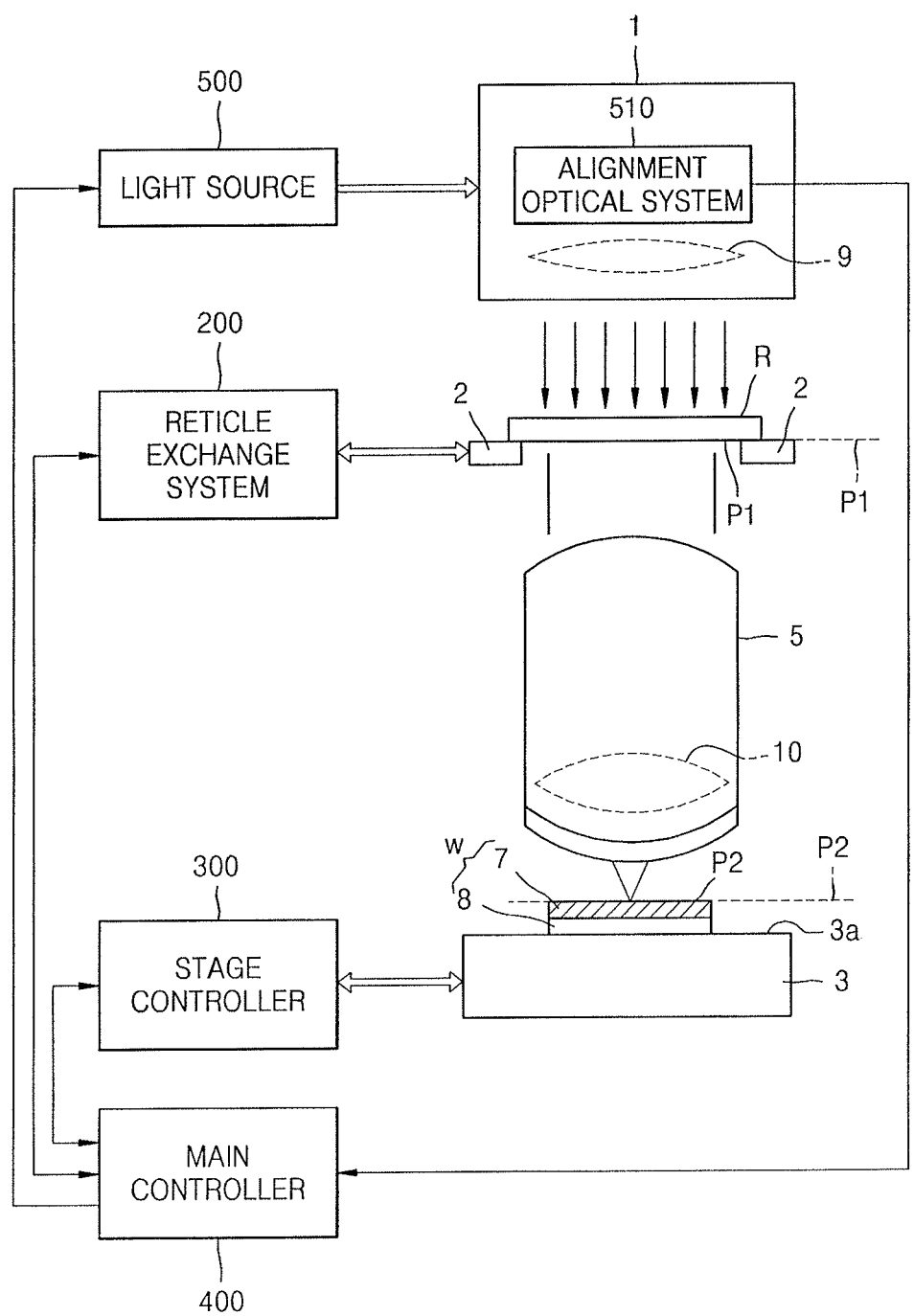
FIG. 15 illustrates a schematic construction diagram of a projection exposure system using an exposure mask, according to an example embodiment.

FIG. 15 illustrates a schematic construction diagram of a projection exposure system using an exposure mask R, according to an example embodiment. Referring to FIG. 15, the projection exposure system may include a wafer stage 3 having a surface 3a on which a substrate 8 (hereinafter, referred to simply together as a "substrate W") coated with photoresist 7 may be placed, an illumination optical system 1 configured to irradiate vacuum UV light having a prepared wavelength as exposure light and transfer a prepared exposure mask R on the substrate W, a light source 500 configured to supply exposure light to the illumination optical system 1, and a projection optical system 5 interposed between a first surface (or an object surface) P1 on which the exposure mask R is disposed to project a pattern image of the exposure mask R onto the substrate W, and a second surface (or an image surface) P2 corresponding to a surface of the substrate W. The illumination optical system 1 may include an alignment optical system 510 configured to adjust relative positions of the exposure mask R and the substrate W. The exposure mask R may be disposed on a stage 2, which may be capable of moving parallel to the surface 3a of the wafer stage 3. A reticle exchange system 200 may exchange and convey the exposure mask R set on the stage 2. The reticle exchange system 200 may include a stage driver configured to move the stage 2 parallel to the surface 3a of the wafer stage 3. The projection optical system 5 may include the alignment optical system 510 that is applicable to a scan-type exposure system.

Pellicles or exposure masks according to example embodiments may be used for the projection exposure system.

Figure 16:
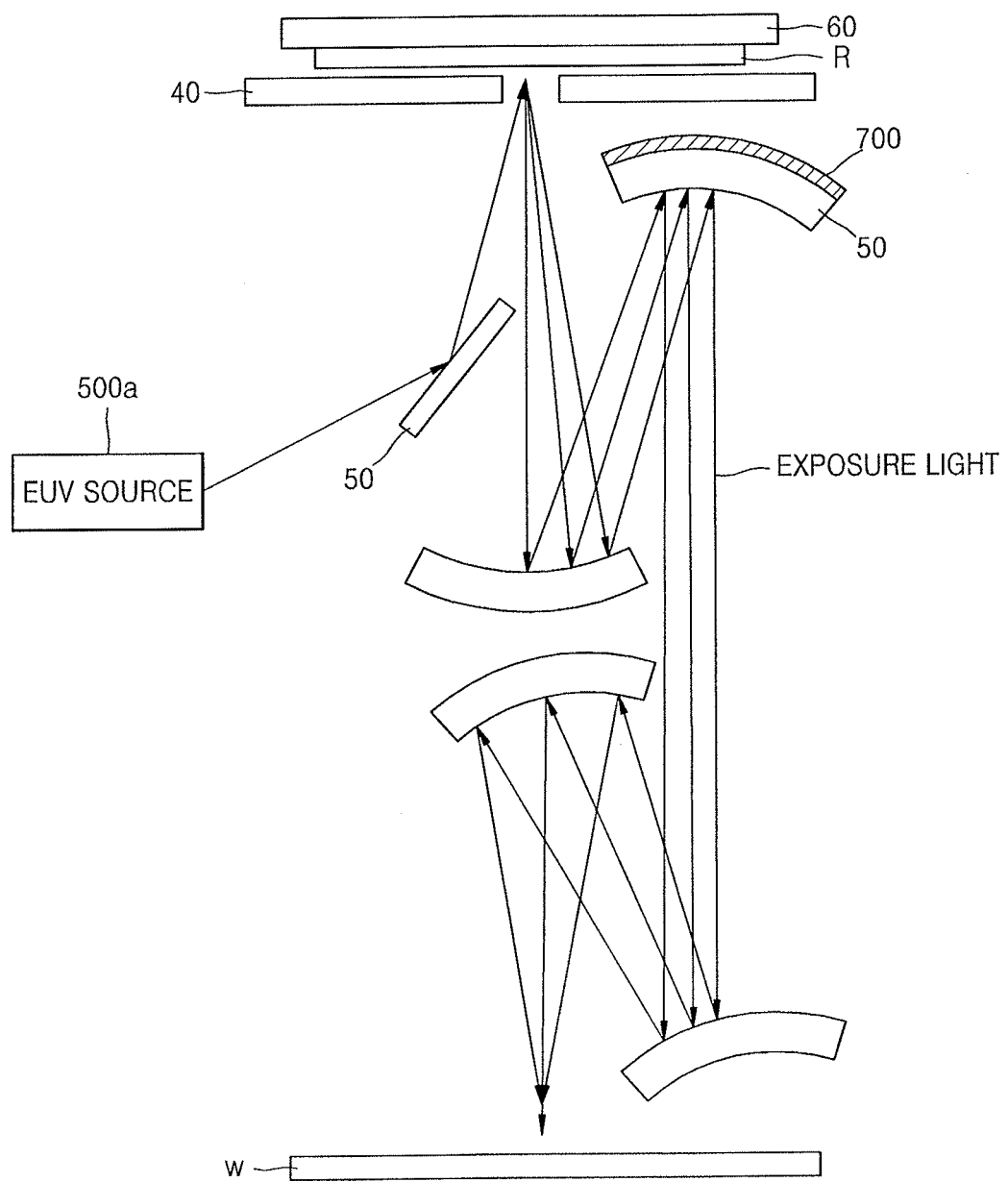
FIG. 16 illustrates a diagram of an extreme ultraviolet (EUV) lithography apparatus according to an example embodiment.

FIG. 16 illustrates a diagram of an extreme ultraviolet (EUV) lithography apparatus according to an example embodiment.

Referring to FIG. 16, the EUV lithography apparatus according to the example embodiment may include a source 500a configured to provide EUV light as exposure light. A slit 40 configured to limit the quantity of exposure light may be introduced in a reflective mask R having a circuit pattern to be transferred onto a wafer W as a mask pattern, and the exposure light may be incident through the slit 40 to the surface of the reflective mask R. The incident exposure light may be reflected by the surface of the reflective mask R with an image of a mask pattern from the reflective mask R through the slit 40.

A lens system may include a plurality of reflective lenses 50 that are combined to provide a light path through which the reflected exposure light reaches the wafer W. In this case, four reflective lenses 50 may be combined to provide a light path through which the reflected exposure light having a pattern image may be transmitted to the wafer W.

Meanwhile, the reflective mask R may be mounted on a mask stage 60. In this case, the mask stage 60 may include a cooling unit configured to cool the mounted reflective mask R using the Peltier effect.

Referring back to FIG. 16, the EUV lithography apparatus may further include a lens cooling unit 700 that is adhered to a rear surface of the reflective lens 50, which forms an optical system, and cools the reflective lens 50 using the Peltier effect.

By way of summation and review, it is urgently necessary to develop pellicles for EUV lithography. In particular, issues such as outgassing due to a combination of a pellicle with an exposure mask by using an adhesive, residue that remains after the pellicle is detached from the exposure mask, and damage to a mask pattern during the removal of the residue, should be addressed.

As described above, embodiments relate to a pellicle, which may leave no residue after being detached from an exposure mask so that it may be unnecessary to use chemicals that may damage a mask pattern, and which may be reused to reduce process costs, and an exposure mask including the pellicle.

Embodiments may provide a pellicle, which may be detached from an exposure mask without leaving residue so that it may be unnecessary to use chemicals that may damage a mask pattern, and which may be recycled to reduce process costs.

Embodiments may also provide an exposure mask including a pellicle, which may leave no residue after being detached from an exposure mask so that it may be unnecessary to use chemicals that may damage a mask pattern, and which may be recycled to reduce process costs, and an exposure mask including the pellicle.

Furthermore, embodiments may provide a method of attaching the pellicle to an exposure mask substrate.

In addition, embodiments may provide a method of detaching the pellicle from the exposure mask substrate.

According to embodiments, even if a pellicle is detached from an exposure mask, no residue may be left so that it may be unnecessary to use chemicals capable of damaging a mask pattern. Also, the pellicle may be reused to reduce process costs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of detaching a pellicle from a photomask, the pellicle including an elastomer attaching element interposed between a pellicle frame and the photomask, the method comprising:
   providing a detaching element at an extending portion of the attaching element, the extending portion being formed of the elastomer; and
   applying a force to the detaching element so as to pull the extending portion in a first direction having a vector component directed normal to the major surface of the photomask and directed toward a backside of the pellicle.

2. The method as claimed in claim 1, wherein the first direction also has a vector component directed parallel to a major surface of the photomask and directed away from a center region of the photomask.

3. The method as claimed in claim 1, further comprising applying a force having a vector component directed normal to the major surface of the photomask and directed toward a backside of the pellicle using a forcing member inserted between the pellicle frame and the photomask.

4. The method as claimed in claim 3, wherein the forcing member is a lever, and a plurality of forcing members and a plurality of extending portions of the attaching element are arranged symmetrically about the pellicle frame.

* * * * *